United States Patent [19]
Jewell

[11] Patent Number: 5,881,085
[45] Date of Patent: Mar. 9, 1999

[54] LENS COMPRISING AT LEAST ONE OXIDIZED LAYER AND METHOD FOR FORMING SAME

[75] Inventor: Jack L. Jewell, Boulder, Colo.

[73] Assignee: Picolight, Incorporated, Boulder, Colo.

[21] Appl. No.: 686,489

[22] Filed: Jul. 25, 1996

[51] Int. Cl.[6] .................................................. H01S 3/19
[52] U.S. Cl. .......................... 372/46; 372/50; 372/96; 257/79
[58] Field of Search ................................ 372/98, 46, 50, 372/96, 44; 257/432, 98, 79

[56] References Cited

U.S. PATENT DOCUMENTS

| | | | |
|---|---|---|---|
| 5,073,041 | 12/1991 | Rastani | 385/33 |
| 5,126,875 | 6/1992 | Tabuchi | 359/319 |
| 5,359,618 | 10/1994 | Lebby et al. | 372/45 |
| 5,493,577 | 2/1996 | Choquette et al. | 372/46 |
| 5,594,751 | 1/1997 | Scott | 372/46 |
| 5,633,527 | 5/1997 | Lear | 372/44 |

OTHER PUBLICATIONS

Coldren, et al., "Dielectric Apertures as Intracavity Lenses in Vertical–Cavity Lasers," Applied Physics Letters, vol. 68, pp. 313–315 (Jan. 1996).

Hegblom, et al., "Estimation of Scattering Losses in Dielectrically Apertured Vertical Cavity Lasers," Applied Physics Letters, vol. 68, pp. 1757–1759 (Mar. 1996).

Choquette, et al., "Low Threshold Voltage Vertical–Cavity Lasers Fabricated by Selective Oxidation," Electronics Letters, vol. 30, pp. 2043–2044 (Nov. 1994).

Dallesasse, et al., "Hydrolization Oxidation of $Al_xGa_{1-x}As$–AlAs–GaAs Quantum Well Heterostuctures and Superlattics," Applied Physics Letters, vol. 57, pp. 2844–2846 (Oct. 1990).

Kish, et al., "Dependence on Doping Type (p/n) of the Water Vapor Oxidation of High–Gap $Al_xGa_{1-x}As$," Applied Physics Letters, vol. 60, pp. 3165–3167 (Apr. 1992).

Ochiai, et al., "Kinetics of Thermal Oxidation of AlAs in Water Vapor," Applied Physics Letters, vol. 68, pp. 1898–1900 (Apr. 1996).

MacDougal, et al., "Electrically–Pumped Vertical–Cavity Lasers with $Al_xO_y$–GaAs Reflectors," Photonics Technology Letters, vol. 8, pp. 310–312 (Mar. 1996).

Hayashi, et al., "Record Low–Threshold Index–Guided InGaAs/Ga AlAs Vertical–Cavity Surface–Emitting Laser with a Native Oxide Confinement Structure," Electronics Letters, vol. 31, pp. 560–562 (Mar. 1995).

Choquette, et al., "Cavity Characteristics of Selectively Oxidized Vertical–Cavity Lasers," Applied Physics Letters, vol. 66, pp. 3413–3415 (Jun. 1995).

Choquette, et al., "Fabrication and Performance of Selectively Oxidized Vertical–Cavity Lasers," IEEE Photonics Technology Letters, vol. 7, pp. 1237–1239 (Nov. 1995).

Deppe, et al., "Atom Diffusion and Impurity–Inducing Layer Disordering in Quantum Well III–V Semiconductor Heterostructures," Journal of Applied Physics, vol. 64, pp. 93–113 (Dec. 1988).

Floyd, et al., "Comparison of Optical Loses in Dielectric–Apertured Vertical–Cavity Lasers," IEEE Photonics Technology Letters, vol. 8, pp. 590–592 (May 1996).

Thibeault, et al., "Reduced Optical Scattering Loss in Vertical–Cavity Lasers Using a Thin (300 Å) Oxide Aperture," IEEE Photonics Technology Letters, vol. 8, pp. 593–595 (May 1996).

*Primary Examiner*—Rodney Bovernick
*Assistant Examiner*—Ellen E. Kang
*Attorney, Agent, or Firm*—Jagtiani & Associates

[57] ABSTRACT

A lens having at least one oxidized layer is provided. Numerous structures for the lens are discussed. Additionally, methods for manufacturing the lens are also discussed. The methods include: 1) variation in thickness of oxidizable layers; 2) variation in thickness of non-oxidizable layers; 3) variation in Al concentration of oxidizable layers; 4) variation in Al concentration of non-oxidizable layers; 5) variation in doping concentration of oxidizable layers; 6) use of interdiffusion between oxidizable and non-oxidizable; 7) local variation in ion implantation dose; and 8) variation in mesa diameter.

24 Claims, 3 Drawing Sheets

LENS COMPRISING AT LEAST ONE OXIDIZED LAYER AND METHOD FOR FORMING SAME

This invention is made with government support under contract number DASG60-96C-0136, awarded by the United States Department of Defense. The government may have certain rights in this invention.

CROSS-REFERENCE TO RELATED APPLICATIONS

This application makes reference to the following U.S. patent applications. The first application is U.S. application Ser. No. 08/574,165, now patented with a U.S. Pat. No. 5,719,891, entitled "Conductive Element with Lateral Oxidation Barrier," filed Dec. 18, 1995. The second application is U.S. application Ser. No. 08/659,942, now patented with U.S. Pat. No. 5,729,566, entitled "Light Emitting Device Having an Electrical Contact Through a Layer containing Oxidized Material," filed Jun. 7, 1996. Both of these applications are hereby incorporated by reference.

BACKGROUND OF THE INVENTION

1. Field of the Invention

The present invention relates generally to light emitting devices, and more particularly to an improved vertical-cavity light emitting device having an improved intra-cavity lens structure formed by selective oxidation.

2. Description of the Prior Art

Vertical-Cavity Surface-Emitting Lasers (VCSELs), Surface Emitting Lasers (SELs) or Light Emitting Diodes (LEDs) are becoming increasingly important for a wide variety of applications including optical interconnection of integrated circuits, optical computing systems, optical recording and readout systems, and telecommunications. Vertically emitting devices have many advantages over edge-emitting devices, including the possibility for wafer scale fabrication and testing, and the possibility of forming two-dimensional arrays of the vertically emitting devices. The circular nature of the light output beams from these devices also make them ideally suited for coupling into optical fibers as in optical interconnects or other optical systems for integrated circuits and other applications.

VCSELs or Surface Emitting Lasers SELs whose current flow is controlled by lateral oxidation processes show the best performances of any VCSELs in terms of low threshold current and high efficiency. In oxidized VCSELs the oxidation occurs in the lateral direction from the sides of etched mesas in the VCSEL wafers, typically under the conditions of 425° C. temperature with high water-vapor content. VCSELs or any other vertical light emitting devices employing laterally oxidized layers have been strictly limited only to structures which have been grown upon gallium arsenide (GaAs) substrates. For further details, see U.S. Pat. No. 5,493,577, by Choquette et al.

Generally, oxide apertures are utilized to control current flow and thus function as current apertures. The appreciation of the use of an oxide aperture for its ability to function as a lens is quite new. It is now known that a lensing aspect of the oxide structure greatly reduces diffractive losses in VCSEL cavities and that this reduction is largely responsible for the greatly improved efficiencies. It is also known that the lens formed by a simple oxide aperture is far from ideal. Light scattered from the abrupt oxide/semiconductor interface is lost from the cavity oscillation. Similarly, optical aberrations in the lens result in cavity losses. Thus it follows that an oxidized structure which more closely resembles an ideal aberration-free lens may form the basis for VCSELs with still greater efficiencies and lower thresholds.

Since VCSELs are presently the subject of intense research and development, a great deal of results and advancements are published monthly. The following is a summary of the prior art documents which are relevant to the problem of utilizing oxide apertures.

The lens-like behavior of oxide-defined apertures are described by Coldren et al. in Appl. Phys. Lett. 68, pp. 313–315 (1996) and in Hegblom et al. in Appl. Phys. Lett. 68, pp. 1757–1759 (1996). Only single layers are used and the publication describes the importance of minimizing the scattering at the inner boundary of the aperture. Means for minimizing the scattering are the use of a thin oxidized layer, e.g. 200 Å, and a tapering of the oxidation in the aperture. Tapering of the aperture has been accomplished by varying the Al concentration within the oxidizable layer, the oxidation proceeding further inward into the aperture for the portion of the layer with higher Al concentration. The tapering is calculated to reduce scattering significantly.

The oxidation rate of materials such as AlGaAs is a sensitive function of the Al concentration as described by Choquette et al. in Electronics Letters 30, pp. 2043–2044 (1994). It is therefore possible to control the extent of oxidation for multiple layers in a single process by having the layers be of different material compositions. It has also been found however, that the precise composition of a pre-oxidized layer may have a profound effect on the reliability of the oxidized structure. For example, oxidized $Al_{0.98}Ga_{0.02}As$ layers appear to be much more reliable than oxidized AlAs layers. Thus, it is preferred that all oxidizable layers in the structure have nominally the same material composition.

Variation of thickness in thin layers of oxidizable material, e.g. AlGaAs, also results in variation of the rates of lateral oxidation. This variation with thickness is described somewhat inaccurately by Dallesasse et al., in Applied Physics Letters 57, 2844–2846 (1990) as a variation with the coarseness of an AlGaAs "alloy." It was observed that the oxidation process occurred much more slowly in a fine scale alloy represented by a superlattice having 70 Å thick AlAs and 30 Å thick GaAs layers as compared to a coarser "alloy" comprising 150 Å AlAs and 45 Å GaAs layers. The variation in oxidation rate with oxidizable layer thickness (when the layers are sufficiently thin, e.g. 300 Å) may be used for the creation of optical and electronic structures comprising multiple oxidized layers in which the layers oxidize at different rates and to different extents.

Related to the use of thin oxidizable layers is the control of the oxidation process by layer interdiffusion which is described by the present inventor in U.S. patent application Ser. No. 08/574165. The present invention does not require layer interdiffusion but may be combined with it.

The oxidation rate of AlGaAs is also sensitive to the doping type, e.g. p-type or n-type, as reported by Kish et al. in Applied Physics Letters, vol. 60, pp. 3165–3167 (1992). They show that $Al_{0.6}Ga_{0.4}As$ etches more than 3 times faster when p-doped at a concentration of $9\times10^{18}$ $cm^{-3}$ as compared to $Al_{0.6}Ga_{0.4}As$ which is n-doped at $4\times10^{17}$ $cm^{-3}$. For a given dopant type, the variation does not depend specific dopant used. The variation is explained by a variation in the Fermi level of the semiconductor which varies with the concentration of charged defects from the dopant.

A thorough discussion on how the oxidation rate varies with temperature is described by Ochiai et al. in Applied Physics Letters, vol. 68, pp. 1898–1900 (1996). The authors show that for low oxidation temperatures and small oxidation depths, the oxidation depth varies linearly with time. For higher oxidation temperatures and/or large oxidation depths, the depth varies as the square root of time.

MacDougal et al. in Photonics Technology Letters 8, pp. 310–312 (1996) describe electrically pumped VCSELs in which both mirrors are oxidized throughout their entire lateral extents and which further comprise oxide-defined current apertures above and below the active region. All the oxidized layers are a quarter-wave thick at the emission wavelength of ~9940 Å. The refractive index of 1.6 for the oxidized layers implies a physical thickness >1500 Å. To produce oxidized layers which are completely oxidized in the mirrors and similar oxidized layers which form apertures above and below the active region, multiple etches and oxidation processes are performed with a silicon nitride capping between the oxidation processes to prevent further oxidation of the aperture layers.

SUMMARY OF THE INVENTION

It is therefore an object of the invention to provide an oxide-formed intra-cavity lens in which optical aberrations and scattering are reduced.

It is another object of the invention to provide an improved oxide-formed intra-cavity lens which is manufacturable.

It is another object of the invention to provide an improved oxide-formed intra-cavity lens which is reliable.

It is another object of the invention to provide an improved oxide-formed intra-cavity lens in which the boundaries of the oxidized regions are tapered.

It is another object of the invention to provide an improved oxide-formed intra-cavity lens in which the aluminum content of the oxidized regions are the same.

It is another object of the invention to provide an improved oxide-formed intra-cavity lens which comprises multiple layers.

It is another object of the invention to provide an improved oxide-formed intra-cavity lens in which the extent of the oxidation is controlled and defined by photolithography.

In all of the above embodiments, it is an object of the invention to provide an improved oxide-formed intra-cavity lens having a gradual oxide/semiconductor interface.

According to one broad aspect of the present invention, there is provided a lens comprising at least a first, second and third lens layers, the first and third lens layers being oxidized in first and third oxidized portions surrounding first and third non-oxidized portions, the second layer disposed between the first and third layers and comprising a non-oxidized semiconductor material, the first and third non-oxidized portions comprising a semiconductor material, each of the oxidized portions having an aluminum contents greater than 20%; and means for reducing scattering and aberration, the means comprising limiting the first and third lens layers to a thickness of less than 200 Å.

According to another broad aspect of the invention, there is provided a lens comprising at least a first, second and third lens layers, the first and third lens layers being oxidized in first and third oxidized portions surrounding first and third non-oxidized portions, the second layer disposed between the first and third layers and comprising a non-oxidized semiconductor material, the first and third non-oxidized portions comprising a semiconductor material; and wherein the first layer has a thickness at least 2% greater than the third layer.

According to another broad aspect of the invention, there is provided a lens comprising at least at least a first and second lens layers, the first and second lens layers being oxidized in first and second oxidized portions surrounding first and second non-oxidized portions, the second lens layer disposed directly in contact with the first lens layer; and an impurity species being doped in the first and/or second layers, the first layer having a doping concentration differing from a doping concentration of the second layer by at least one times $10^{17}$ per cubic centimeter.

According to another broad aspect of the invention, there is provided a lens comprising: at least a first lens layer, the first lens layer comprising a first oxidized portion and a first non-oxidized portion, the first lens layer comprising a semiconductor having an aluminum content greater than 20%, the first layer being doped by an impurity species within the first layer, the impurity species having a doping concentration which varies across a thickness of the first layer by at least one times $10^{17}$ per cubic centimeter; and the first oxidized portion having a thickness which is minimum near center of the non-oxidized portion and which continuously increases outwardly from the non-oxidized portion.

According to another broad aspect of the invention, there is provided a lens comprising: at least a first lens layer, the first layer comprising a first oxidized portion and a first non-oxidized portion, the first layer comprising a semiconductor material having an aluminum content greater than 20%; the first layer being doped by an impurity species, the impurity species having a doping concentration which varies across a thickness of the first layer by at least one times $10^{17}$ per cubic centimeter; the first oxidized portion having a thickness which is minimum near a center of the first non-oxidized portion and which continuously increases in a direction away from the first non-oxidized portion; a second layer adjacent to the first layer, the second layer comprising a non-oxidized semiconductor material; and a third layer adjacent to the second layer, the third layer comprising a third oxidized portion and a third non-oxidized portion, the third layer comprising a semiconductor material.

According to another broad aspect of the invention, there is provided a lens comprising: at least a first lens layer having a first thickness, the first lens layer comprising a first oxidized portion and a first non-oxidized portion, the first lens layer comprising a semiconductor material having a first aluminum content greater than 20%; at least a second layer having a second thickness and in communication with the first layer, the second layer comprising a non-oxidized semiconductor having a second aluminum content not equal to the first aluminum content; at least a first interdiffused region partially disposed in the first non-oxidized portion which comprises materials from both of the first and second layers, the first interdiffused region penetrating the first non-oxidized portion to a first greatest thickness in a first sub-region and to continuously decreasing thicknesses in regions laterally outward from the sub-region; the first oxidized portion having a least thickness near the sub-region and having an increasing thickness away from the sub-region.

According to another broad aspect of the invention, there is provided a lens comprising: at least a first lens layer having a first thickness, the first lens layer comprising a first oxidized portion and a first non-oxidized portion, the first lens layer comprising a semiconductor material having a first aluminum content greater than 20%; at least a second layer adjacent to the first layer, the second layer comprising a non-oxidized semiconductor having a second aluminum content not equal to the first aluminum content; at least a first interdiffused region aligned with the first non-oxidized portion which comprises materials from both of the first and second layers, the first interdiffused region partially disposed in the first non-oxidized portion to a greatest thickness; the greatest thickness being less than the first thickness, a difference between the first thickness and the greatest thickness being sufficiently small to reduce an oxidation rate of the first layer in the interdiffused region to less than 50% of an oxidation rate of the first layer outside of the interdiffused region.

According to another broad aspect of the invention, there is provided a lens comprising: at least a first lens layer comprising a semiconductor material having an aluminum content greater than 20%, the first lens layer comprising a first portion substantially surrounded by a second portion; the first portion containing a first impurity species which decreases its susceptibility to oxidation relative to the second portion; and the second portion forming a substantially oxidized portion, the first portion forming a substantially non-oxidized portion.

According to another broad aspect of the invention, there is provided a lens comprising: at least a first lens layer comprising a semiconductor material having an aluminum content greater than 20%, the first lens layer comprising a first portion substantially surrounded by a second portion; the second portion containing a first impurity species which increases its susceptibility to oxidation relative to the first portion; and the second portion forming a substantially oxidized portion, the first portion forming a substantially non-oxidized portion.

According to another broad aspect of the invention, there is provided a method for producing a lens. The method comprising the steps of: epitaxially growing at least a first layer which is non-oxidizable; epitaxially growing at least a second layer which is oxidizable; epitaxially growing at least a third layer which is non-oxidizable; disposing the second layer on the first layer and disposing the third layer on the second layer; introducing ions into the first, second and third layers and interdiffusing atoms comprising the first, second and third layers forming interdiffused regions, the amount of interdiffusion being greatest near a center of the interdiffusion regions and lesser away from the center; etching through at least the third layer; oxidizing the second layer forming an oxidized portion at least in regions outside of the interdiffused regions; the oxidized portion having a minimum thickness near the center and greater thickness away from the center.

Other objects and features of the present invention will be apparent from the following detailed description of the preferred embodiment.

BRIEF DESCRIPTION OF THE DRAWINGS

The invention will be described in conjunction with the accompanying drawings, in which.

DETAILED DESCRIPTION OF THE PREFERRED EMBODIMENT

Figure 1:
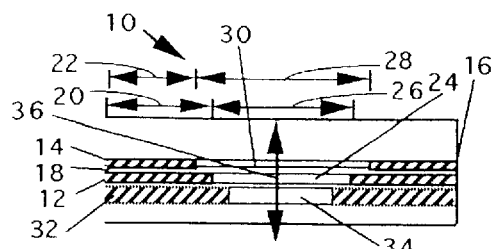
FIG. 1 is a cross section of an oxide lens comprising multiple oxidized layers having different thicknesses which is constructed in accordance with a preferred embodiment of the invention.

With reference to the Figures, wherein like reference characters indicate like elements throughout the several views and, in particular, with reference to FIG. 1, a cross section of lens 10 is illustrated which has multiple oxidized layers and non-oxidized layers. The various layers are preferably semiconductor layers comprising group-III and group-V elements, for example: AlP, AlAsP, AlGaAs, AlGaAsP, AlAs, AlAsP, AlPSb, AlGaPSb, InAlAs, InAlGaAs, InAlGaAsP, AlAsSb, AlAsSbP, AlGaAsSb, InGaAlAsSbP, AlSb, AlPSb, AlGaP or inAlGaAsSb, or any combination thereof for the oxidizable layers and GaAs, AlGaAs, InAlGaAs, InAlGaP, GaAsSb, GaPSb, AlGaPSb, InGaAs, or InGaAsP, AlPSb, AlGaP or InAlGaAsSb, or any combination thereof for the non-oxidizable layers. Preferably, the layers are deposited by an epitaxial growth process such as molecular beam epitaxy, metal-organic vapor phase epitaxy, or other epitaxial processes.

A preferred method for oxidizing the oxidizable layers is to form a mesa by etching, then place the structure in a water vapor environment at a temperature greater than 300° C. The oxidation then proceeds from outer sidewall 16 until the oxidation conditions are removed. For the oxidization process used in the preferred embodiment, it is preferable to maintain at least two times the oxidation rate between the oxidizable and non-oxidizable semiconductor materials.

The term oxidizable and oxidized are used consistently throughout the application and it should be appreciated that at least extensive parts of the oxidizable layers are oxidized during fabrication and thus produce oxidized regions or layers. By an oxidizable material or layer, applicant means any group III–V material with sufficient aluminum (Al) content which may be oxidized significantly under the process for manufacturing lens 10. For example, the initial Al content may be greater than 20% of the group III material. By an oxidized semiconductor material or layer, applicant means any region of an Al bearing III–V material where oxygen has replaced the group V material in a proportion being greater than or equal to 90%.

By a non-oxidized semiconductor material, applicant means any III–V material where oxygen has replaced the group V material in a proportion being less than or equal to 10%. The term non-oxidizable and non-oxidized are used consistently throughout the application and it should be appreciated that the non-oxidizable layers are not extensively oxidized during fabrication and thus produce non-oxidized layers.

Turning now to FIG. 1, lens 10 comprises oxidized layers 12 and 14 and non-oxidized layer 18. In this embodiment layers 12 and 14 are thin, preferably less than 300 Å, and layer 12 is thicker than layer 14. For example, layer 12 may be about 100 Å thick and layer 14 may be about 80 Å thick. Since the oxidation proceeds more rapidly for thicker layer 12 than for layer 14, oxidation depth 20 for layer 12 is greater than oxidation depth 22 for layer 14. Accordingly, a non-oxidized region 24 of layer 12 has a width 26 which is smaller than width 28 of a non-oxidized region 30 of layer 14. In a preferred embodiment, layer 12 would be at least 2% thicker than layer 14. As may be seen, non-oxidized layer 18 is disposed between layers 12, 14 and will have a thickness which is thick enough to avoid intermixing in the optical cavity, i.e., between 10 Å and 900 Å. Lens 10 has a width corresponding to the largest non-oxidized region. In this embodiment, the lens width would correspond to the width of region 30. Preferably, the lens will have a width between 3 to 10 microns. Therefore, width 28 will be less than or equal to 10 microns.

It should be appreciated that any number of additional layers may be added such as optional layer 32. Optional layer 32 is illustrated to be thicker than layer 12 or layer 14, and has a non-oxidized region 34 having a width smaller than width 26 or width 28. In a preferred embodiment, non-oxidized regions 24, 30 extend entirely through layers 12 and 14, respectively. Additionally, the area associated with region 30 has an area which is at least 4% larger than the area associated with region 24.

The variation of widths of non-oxidized regions 24, 30 and 34 may form a lens-like shape which controls light beam 36 with less scattering and less aberration than would a single layer having oxidized and non-oxidized regions. It should be appreciated that by having layers 12, 14 have a thickness below 200 Å thick, unexpected results are generated. First, the ability to finely control the diameter of the optical cavity and respective widths 26, 28 are greatly increased since it has been determined that there is a non-linear relationship between the thickness of a layer and the oxidation rate. Second, having two thin layers 12, 14 disposed adjacent to layer 18 allows for an oxide/ semiconductor interface which is gradual, i.e., having steps on the order of ⅒ or less of the wavelength of light in the material. For example, for emission at 0.85 microns the wavelength of light in the material is about 2500 Å Thus, the layer thickness is on the order of 250 Å or less. In this case, a desired beam diameter is about 2 to 5 microns and the width of lens 10 may be 4 to 10 microns. For longer wavelengths, 1.5 microns, the thicknesses and widths would be proportionately larger. This, in turn, provides for less scattering and less aberration than would a single or multiple thick layers having oxidized and non-oxidized regions. As illustrated, lens 10 approximates a plano-convex lens which is well known in the art of optics.

Figure 2:
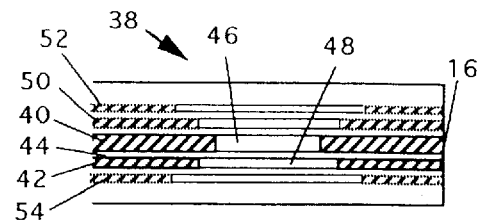
FIG. 2 is a cross section of an oxide lens comprising multiple oxidized layers having different thicknesses which is constructed in accordance with an alternate embodiment of the invention.

Turning now to FIG. 2, there is shown lens 38 comprising oxidized layers 40 and 42 with non-oxidized layer 44 between them. As illustrated, layer 40 is thicker than layer 42 and accordingly, non-oxidized region 46 has a smaller width than the width of non-oxidized region 48. As illustrated, lens 38 may have additional oxidized layers such as optional layers 50, 52 and 54. Lens 38 approximates a "split lens," which is known in the field of optics to be two plano-convex lenses placed with their curved sides toward each other.

Figure 3:
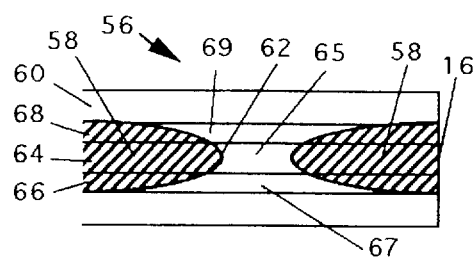
FIG. 3 is a cross section of an oxide lens comprising multiple oxidized layers having different thicknesses and intermixed with intervening layers which is constructed in accordance with yet another embodiment of the invention.

Turning now to FIG. 3, there is shown lens 56 comprising oxidized regions 58 in layers 64, 66 and 68 and non-oxidized layer 60. Since the oxidation rate varies with the dopant type and concentration, the shapes of inner boundaries 62 may be controlled by adjusting the dopant type and/or concentration in each layer 64, 66 and/or 68. This control may be achieved by varying the doping type and concentration of dopant in layers 64, 66 and 68. For example, layer 64 may be p-doped with an average concentration which is greater than that of either layer 66 or layer 68. In a preferred embodiment, the concentration of dopant for layer 64 would differ from the concentration of layers 66 and/or 68 by at least one times $10^{17}$ per cubic centimeter. The exact shape of boundaries 62 may be elliptical, as illustrated, or some other shape. Preferably, boundaries 62 would be shaped to minimize optical aberrations and to provide the desired amount of optical focusing power. As may be seen, a non-oxidized regions 65, 67 and 69 correspond to respective layers 64, 66 and 68, and extend through these respective layers. In a preferred embodiment, the area associated with regions 67, 69 will be at least 4% larger than the area associated with region 65. Finally, it should be appreciated that layer 64 and 66 may be doped with the same impurity species or opposite impurity species. For example, layer 64 may be "p" type and layer 66 may be "n" type. It is desirable to maintain layers 64, 66 and 68 in close proximity. Therefore, in a preferred embodiment, the center of layer 66 would be separated by less than 1000 Å from the center of layer 68.

Figure 4:
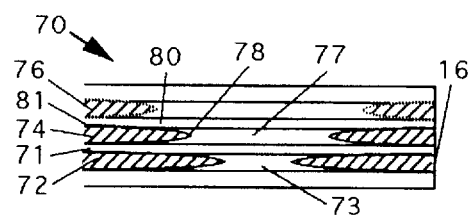
FIG. 4 is a cross section of an oxide lens comprising multiple oxidized layers which have been intermixed with intervening layers which is constructed in accordance with yet another embodiment of the invention.

Turning now to FIG. 4, there is shown lens 70 comprising multiple oxidized layers 72, 74, and 76 and non-oxidized layer 71, in which the thicknesses of layers 72 and 74 are approximately the same, but the oxidation rates are different. As illustrated, layer 72 has a higher oxidation rate than does layer 74. The higher oxidation rate in layer 72 may be accomplished, for example, by growing layer 72 to have a higher aluminum concentration than layer 74 by at least 0.01%. This change in Al concentration corresponds to a ~0.66% change in oxidation rate. For a 15 $\mu$m nominal oxidation depth and a linear dependence of the depth v. time, this difference would then produce a 0.1 $\mu$m difference in oxidation depth and therefore a 0.2 $\mu$m difference in the diameter of the non-oxidized region.

Alternatively, layer 72 may have a higher concentration of p-type doping than layer 74. Equivalently, layer 72 may have a lower n-type doping concentration than layer 74. In a preferred embodiment, the concentration differences would be at least one times $10^{17}$ per cubic centimeter. As illustrated, the inner boundaries 78 may be shaped, for example by varying the doping and/or aluminum concentration within a single layer. In a preferred embodiment, this may be accomplished by varying the doping concentration across a thickness of layer 72 by at least one times $10^{17}$ per cubic centimeter. Furthermore, variations in doping and/or aluminum concentration may be combined with variations in thicknesses of any of the layers. Additional layers such as optional oxidized layer 74 and optional non-oxidized layer 80 may also be incorporated into lens 70. In a similar fashion to FIG. 3, the area associated with non-oxidized region 77 will be at least 5% larger than the area associated with region 73. Additionally It is desirable to maintain layers 72 and 76 in close proximity. Therefore, in a preferred embodiment, the center of layer 72 would be separated by less than 1000 Å vertical direction from the center of layer 76.

Figure 5A:
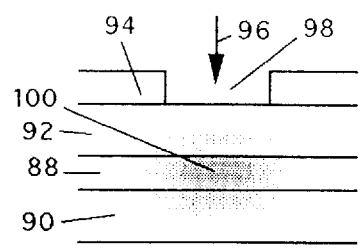
FIGS. 5a, 5b and 5c are cross sections of an oxide lens in which a boundary of the oxidized layer is shaped by variation of the doping concentration which is constructed in accordance with yet another embodiment of the invention.
Figure 5B:
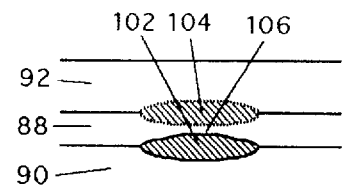
Figure 5C:
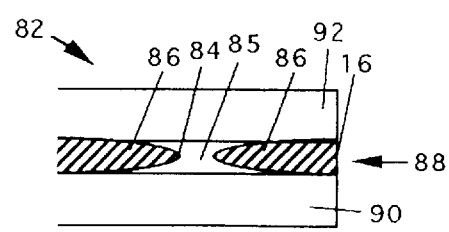

Turning now to FIGS. 5a, 5b and 5c, there is shown a method for controlling the diameter of lens 82 and for shaping inner boundaries 84 of oxidized regions 86. The control method is based on the method described in U.S. patent application Ser. No. 08/574,165, now patented with a U.S. Pat. No. 5,719,897, which is incorporated herein by reference.

Turning now to FIG. 5a, there is shown an ion implantation step upon a semiconductor layer structure comprising oxidizable layer 88 and non-oxidizable layer 90. Also shown is optional non-oxidizable layer 92. Mask 94, for example photoresist, blocks the bombardment of ions 96 except in preselected regions 98. The result is a distribution of implanted ions 100 which is most dense in its center and gradually becomes less dense above, below and to either side of the center.

Turning now to FIG. 5b, there are shown interdiffused region 102 and optional interdiffused region 104. Although the implanted ions 100 illustrated in Figure 5a are still present, they are not illustrated in FIG. 5b for reasons of clarity. The interdiffusion is performed by high-temperature annealing of the structure. Interdiffusion occurs to the greatest degree in regions where the concentration of implanted ions is the highest, hence the interdiffusion penetrates deepest into layer 88 in the center of the implanted region and drops to much lower depths away from the center. As illustrated, there is a non-interdiffused region 106 in the center of the implanted region, however it is also possible to have the interdiffusion completely traverse layer 88 over a finite area. It should be appreciated that the Al content of layer 88 will vary depending on whether one looks at the interdiffused region 102 or the non-interdiffused region of layer 88. For example, if layer 88 has an initial Al concentration of 20% or more of the group III material, and layer 90 has a concentration which is less than 20%, then, interdiffused region 102, being a mix of layers 88 and 90, will have a final Al concentration which is less than the initial concentration. Thus, layer 88 will have an oxidized region 86 having a final Al concentration of 20% or more and a non-oxidized region 85 where the final Al concentration is less than 20%.

When layer 88 is oxidized, lens 82 illustrated in FIG. 5c is formed. Although interdiffused regions 102 and 104 illustrated in FIG. 5b are still present, they are not illustrated in FIG. 5c for reasons of clarity. When both interdiffused regions 102 and 104 are present and approximately equal in extent, inner boundaries 84 may be approximately symmetrical in the vertical dimension, as shown. Even if non-interdiffused region 106 exists, it may be thin enough to provide a significant impedance to the oxidation. For example, in a preferred embodiment layer 88 may comprise a 200 Å thick layer of undoped $Al_{0.98}Ga_{0.02}As$ and layers 90 and 92 may be GaAs. The ions used in the implantation may comprise a combination Ga and C. In the center region, the interdiffusion may occur significantly to a depth of about 60 Å from both layers 90 and 92. The depth of the interdiffusion is not precisely defined since its boundary is not sharp. However the depth may be usefully defined in this case as the depth at which the material composition of layer 88 has been modified enough for its oxidation rate to be reduced by a factor of 10. In this example, non-interdiffused region 106 would be 80 Å thick and its outer portions would still have a greatly reduced oxidation rate. Thus the thickness of layer 88 which is left nominally unchanged may be only 50 Å or less, which would strongly inhibit the oxidation process.

It should be appreciated that as layer 88 is oxidized, the oxidation process is slowed by the implanted ions 100 and/or interdiffused region 102. Therefore, as the density of ions 100 increase, the portion of layer 88 that is oxidized in that local region is decreased. For a complete discussion of the effect of ion implantation, see the discussion of FIGS. 11 and 12, below. As may be seen in FIG. 5c, by properly implanting ions 100, non-oxidized region 85 may be provided which extends entirely through layer 88. Additionally, the oxidized portion 86 of layer 88 has a thickness which is a minimum near the center of the non-oxidized region 85 and continuously increases outwardly therefrom. It is important to note that it is not necessary for the interdiffusion process to completely stop the oxidation process. A sufficient slowdown of the process allows reasonable tolerances in the timing of the oxidation so that a manufacturable process results.

Figure 6:
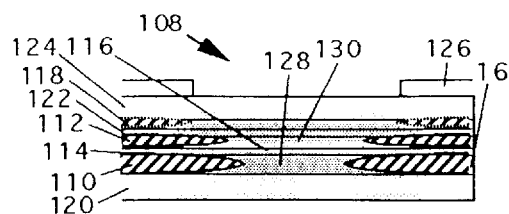
FIG. 6 is a cross section of an oxide lens comprising multiple oxidized layers in which the boundaries of the oxidized layers are shaped by variation of the doping concentration which is constructed in accordance with yet another embodiment of the invention.

Turning now to FIG. 6, there is shown lens 108 formed using an extension of the method described above and illustrated in FIGS. 5a, 5b and 5c. Lens 108 comprises oxidized layers 110 and 112 having nominally equal material compositions, separated by non-oxidized layer 114. Also illustrated in FIG. 6 is the ion distribution 116 of implanted ions used to form lens 108. In lens 108, ion distribution 116 is made to provide approximately equal ion dosages at the interfaces between layers 110, 112 and 114, and also inclusive of optional oxidized layer 118 and optional non-oxidized layers 120, 122 and 124. For illustrative purposes, the former position of mask 126 which was used to mask the ion implantation, is shown in FIG. 6 even though the mask would not be still present after the formation of lens 108. To achieve the approximately equal dosages at the different depths, multiple ion implants at different energies may be used. Both layers 110 and 112 are sufficiently thick, e.g. 200 Å, and the interdiffusion penetration into the layers is sufficiently thin, e.g. 40 Å on each side, that the oxidation process is not stopped but is slowed down considerably, e.g. by a factor of 2 or more. Layer 114 is thinner than layer 110; for example their thickness may be 210 Å and 190 Å, respectively. Thus, the oxidation will proceed further in layer 110 than it does in layer 112, resulting in non-oxidized region 128 of layer 110 having a narrower width than the width of non-oxidized region 130. For example, width 128 may be 1.8 $\mu$m and width 130 may be 2.6 $\mu$m. It is also possible to add additional layers such as layer 118, which may also have a thickness different from layers 110 or 112, and therefore have a different width of its non-oxidized region (not labeled but readily apparent). Lens 108 approximates a plano-convex lens with the convex side on the bottom. Lens 108 could also be made to approximate a plano-convex lens with the convex side on top, or a variety of other lens shapes.

Figure 7:
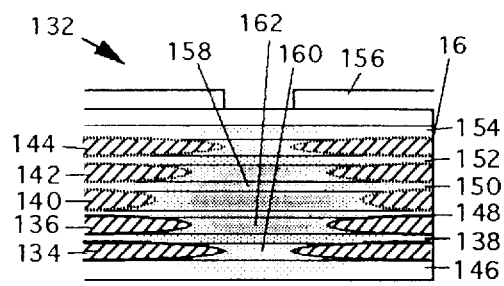
FIG. 7 is a cross section illustrating the use of interdiffusion to provide an oxide lens layer in which the boundary of the oxidized layer is shaped by interdiffusion with adjacent layers which is constructed in accordance with yet another embodiment of the invention.

Turning now to FIG. 7, there is shown lens 132 comprising oxidized layers 134 and 136 having approximately equal thicknesses and nominally equal material compositions, and non-oxidized layer 138 between them. Also illustrated are optional oxidized layers 140, 142 and 144, also having approximately the same thicknesses as layers 134 and 136, and optional non-oxidized layers 146, 148, 150, 152 and 154. For illustrative purposes, the former position of mask 156 which was used to mask the ion implantation, is shown in FIG. 7 even though the mask would not be still present after the formation of lens 132. Ion distribution 158 is shown to be nonuniform both in the vertical and horizontal dimensions, with the maximum dosage illustrated to lie in optional layer 140. The interface between oxidized layer 134 and non-oxidized layer 138 has a ion dosage smaller than the dosage at the interface between oxidized layer 136 and non-oxidized layer 138. Thus material from layer 138 will be interdiffused more deeply into layer 136 than into layer 134, and therefore the oxidation will proceed more slowly in the implanted region of layer 136 than in the implanted region of layer 134. The width of non-oxidized region 160 of layer 134 is therefore narrower than the corresponding width of non-oxidized region 162 of layer 136. With the optional oxidized and non-oxidized layers as illustrated, lens 132 approximates a symmetric double convex lens.

Figure 8:
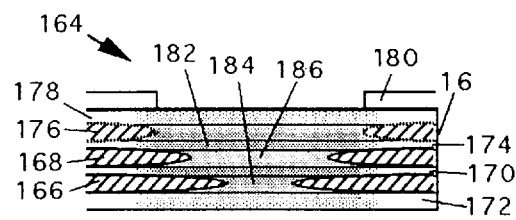
FIG. 8 is a cross section of a VCSEL containing an oxide-defined current aperture and an oxide-defined intracavity lens which is constructed in accordance with yet another embodiment of the invention.

Turning now to FIG. 8, there is shown lens 164 comprising oxidized layers 166 and 168 having approximately equal thicknesses and nominally equal material compositions, separated by non-oxidized layer 170 and further comprising non-oxidized layers 172 and 174. Lens 164 further comprises optional oxidized layer 174 and optional non-oxidized layers 176 and 178. For illustrative purposes, the former position of mask 180 which was used to mask the ion implantation, is shown in FIG. 8 even though the mask would not be still present after the formation of lens 164. Ion distribution 182 is shown to be approximately uniform both in the vertical and horizontal dimensions.

The width of non-oxidized region 184 in layer 166 may be made narrower than the corresponding width of non-oxidized region 186 in layer 168 in at least three ways. First, the material composition of non-oxidized layers 170, 172 and 174 may differ. In VCSELs grown on Gas substrates for example, layers 170, 172 and 174 may all comprise AlGaAs, but the Al concentration in layer 174 may be lower than that of layer 172, which is in turn lower than that of layer 170. Prior to the interdiffusion, layers 166 and 168 have nominally equal material compositions, for example $Al_{0.98}Ga_{0.02}As$. Thus, even with equal degrees of intermixing at all the layer interfaces, the average Al content of layer 166 will be reduced less than that of layer 168; i.e. after the interdiffusion, the ion implanted region of layer 168 will have a lower Al concentration than layer 166. The oxidation rate of the ion implanted region of layer 168 will therefor e have a slower rate of oxidation than the ion implanted region of layer 166, and the structure illustrated in FIG. 8 results. For VCSELs grown on InP substrates, oxidized layer s 166 and 168 may initially comprise InAlAs, InAlAsSb or AlAsSb. Non-oxidized layers 170, 172 and 174 may initially comprise material s of the family InAlGaAsP wherein the compositions differ, but wherein for example, layer 172 has a higher Al concentration and/or lower P concentration than layer 174.

A second means for controlling the widths of non-oxidized regions 184 and 186 is by varying the thicknesses of non-oxidizing layers 170, 172 and 174. Additionally and advantageously, all the non-oxidizing layers may be quite thin, e.g. less than 300 Å, and may furthermore be thinner than oxidizing layers 166 and 168. To achieve the lens illustrated in FIG. 8 by this means, layer 172 would be thinner than layer 170, which in turn would be thinner than layer 174. The interdiffusion process occurs sufficiently that layers 170, 172 and 174 are almost completely interdiffused with layers 166 and 168. Thus layer 172, being thinner, contributes less oxidation-inhibiting material to layer 166 than is contributed by layer 174 to layer 168. Thus the ion implanted region of layer 166 will oxidize faster than the corresponding ion implanted region of layer 168, and non-oxidized region 184 of layer 166 will have a smaller width than the width of non-oxidized region 186 of layer 168.

For the third means, see the discussion relating to FIG. 7.

Figure 9:
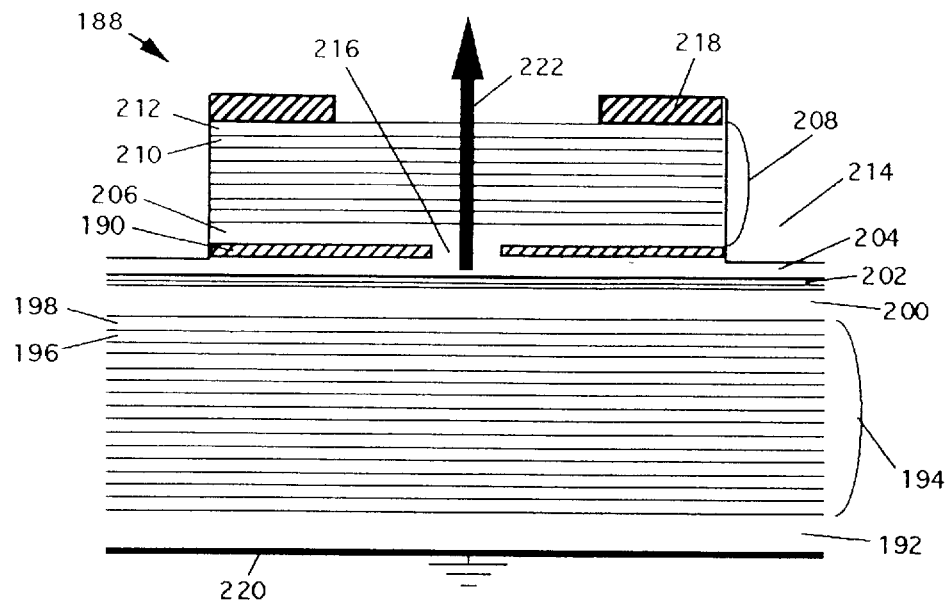
FIG. 9 is a cross section of a VCSEL containing two oxide-defined current apertures, an oxide-defined intracavity lens, and two oxide-containing mirrors which is constructed in accordance with yet another embodiment of the invention.

Turning now to FIG. 9, there is shown light emitter 188 which comprises lens 190. Emitter 188 is preferably a VCSEL, but it could also be a resonant-cavity light emitting diode (RCLED). Emitter 188 may be grown on substrate 192. Bottom mirror 194 comprises high-index layers 196 and low-index layers 198. On bottom mirror 194 is grown bottom spacer 200, active region 202, top spacer 204, and the semiconductor structure comprising at least one oxidizable layer which will form lens 190. Lens 190 may be any of the lens structures described above or utilize any combination of the described structures and methods. On top of lens 190 may be optional spacer 206 and top mirror 208 comprising low-index layers 210 and high-index layers 212. If substrate 192 comprises GaAs bottom mirror 194 may preferably comprise alternating semiconductor layers such as GaAs for layers 196 and AlAs for layers 198. If substrate 192 comprises InP, bottom mirror may preferably comprise alternating semiconductor and oxidized layers, such as InGaAs or InP for layers 196 and an oxide of InAlAs, InAlAsSb or AlAsSb for layers 198. Top mirror 208 may comprise similar materials as bottom mirror 194, or it may furthermore comprise dielectric materials. To perform the oxidation process to form lens 190, region 214 is formed, for example by etching. After the oxidation process, lens 190 has non-oxidized region 216. Since the oxidized regions of lens 190 have electrical resistively typically much higher than 10 times as high as non-oxidized region 216, non-oxidized region 216 forms an electrical current aperture. Contacts 218 and 220 are deposited and preferably annealed. The exact positions of contacts 218 and 220 are determined partly by choice. When an electrical current is passed between contacts 218 and 220, the majority of the current passes through the current aperture formed by non-oxidized region 216 in lens 190. The current creates electrons and holes in active region 202 which recombine to emit light. Light which emits substantially perpendicular to the surfaces of mirrors 194 and 208 may be amplified to form light beam 222 emitting at an emission wavelength. When emitter 188 is a VCSEL and the current is above the VCSEL's current threshold, beam 222 is a laser beam. In mirror 194 or mirror 208, one period of the high- and low-index layers is nominally one half of the emission wavelength divided by the average index of the high- and low-index layers, weighted by their thicknesses.

Figure 10:
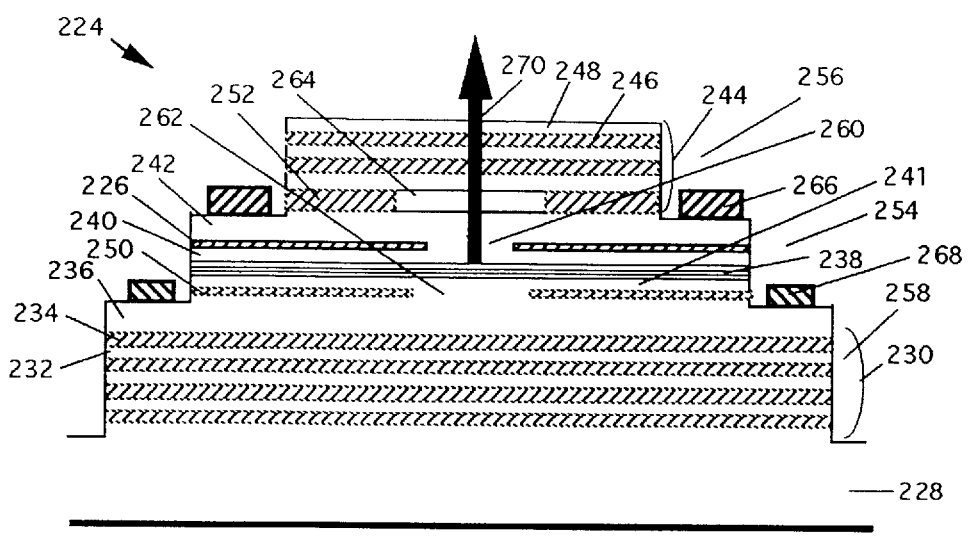
FIG. 10 is a cross section of a VCSEL which is constructed in accordance with yet another embodiment of the invention.

Turning now to FIG. 10, there is shown light emitter 224 which comprises lens 226. Emitter 224 is preferably a VCSEL, but it could also be a RCLED. Emitter 188 may be grown on substrate 228. Bottom mirror 230 comprises non-oxidized layers 232 and oxidized layers 234. On bottom mirror 230 an optional bottom spacer 236 is grown. An active region 238 is disposed above mirror 230. As may be seen, optional spacers 240, 241 may be provided between lens 226 and optional lens 250. Lenses 226 and/or 250 may be any of the lens structures described above or utilize any combination of the described structures and methods. On top of lens 226 may be optional spacer 242 and top mirror 244 oxidized layers 246 and non-oxidized layers 248. Top mirror 244 may comprise similar materials as bottom mirror 230, or it may furthermore comprise dielectric materials. Contacts 266 and 268 are deposited and preferably annealed in order to provide electrical communication with device 224. The exact positions of contacts 218 and 220 are determined partly by choice. When an electrical current is passed between contacts 266 and 268, the majority of the current passes through the current aperture formed by lens 226. The current creates electrons and holes in active region 238 which recombine to emit light. Light which emits substantially perpendicular to the surfaces of mirrors 244 and 230 may be amplified to form light beam 270 emitting at an emission wavelength. When emitter 224 is a VCSEL and the current is above the VCSEL's current threshold, beam 270 is a laser beam.

It should be appreciated that FIGS. 9 and 10 merely illustrate known configurations of VCSEL's where the inventive lens has been placed in the optical cavity of the VCSEL. This invention contemplates any VCSEL structure so long as an optical cavity is present. For an example of other VCSEL designs, see U.S. patent application Ser. No. 08/574,165, now patented with a U.S. Pat. No. 5,719,891, which is hereby incorporated by reference.

Figure 11A:
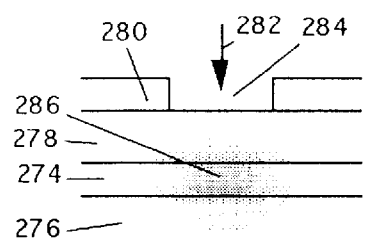
FIGS. 11a and 11b are cross sections of an oxide lens in which a boundary of the oxidized layer is shaped by yet another embodiment of the invention.
Figure 11B:
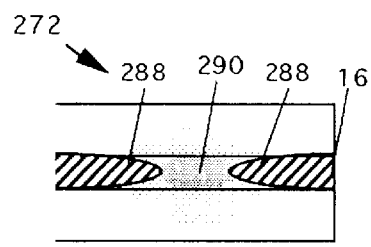

Turning now to FIGS. 11a and 11b, there is shown lens 272 and another method for controlling the diameter of lens 272. As may be seen, a semiconductor layer structure comprising oxidizable layer 274 and non-oxidizable layer 276 is provided. Additionally, an optional non-oxidizable layer 278 may also be provided. Mask 280, for example photoresist, blocks bombardment of ions 282 except in preselected regions 284. The result is a distribution of implanted ions 286 which is most dense in its center and is less dense above, below and to either side of the center.

Oxidizable layer 274 is accessed, for example, by an etch process which creates mesa edge 16. An oxidation process is then performed which substantially oxidizes oxidizable layer 274 in oxidized regions 288. For details, see the discussion with regard to FIG. 5, above. Under the conditions of oxidation, implanted ions 286 modify the oxidation rate of oxidizable layer 274, preferably decreasing the oxidation rate by at least a factor of 1.5 compared to regions of oxidizable layers 274 not receiving the implantation. When layer 274 is oxidized in regions 288, but not in regions 290, lens 272 illustrated in FIG. 11b, is formed. Preferably, implanted ions 286 are dopant ions of either p-type or n-type. Furthermore, when lens 272 is part of a device comprising a p-n junction, it is desirable that the doping type match the side of the junction on which lens 272 resides. For example, if lens 272 is on the p-side, of the junction, it is desirable that implanted ions 286 comprise p-type dopant. This will decrease electrical resistance to the flow of electrical current through lens 272. In some cases, it may be preferred to perform an annealing step to enhance the effect of implantation ions 286. As illustrated in FIG. 11b, regions 288 may have a tapered profile which is at least partially due to the distribution of implanted ions 286 (shown in FIG. 11a).

In a preferred embodiment, oxidizable layer 274 may comprise a 700 Å thick layer of undoped $Al_{0.98}Ga_{0.02}As$, and layers 276 and 278 may be AlGAAs. The ions used in the implantation may comprise Si and the dosage my produce a volume density of about $1-5\times10^{18}cm^{-3}$. In the implanted region below the mask, the Si ions decrease the oxidation rate to about ⅔ the rate for the non-implanted regions. It is important to note that it is not necessary for the implantation process to completely stop the oxidation process. A sufficient slowdown of the process allows reasonable tolerances in the timing of the oxidation so that a manufacturable process results.

Figure 12A:
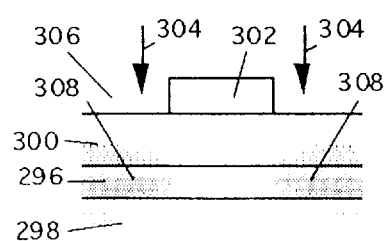
FIGS. 12a and 12b are cross sections of an oxide lens in which a boundary of the oxidized layer is shaped by yet another embodiment of the invention.
Figure 12B:
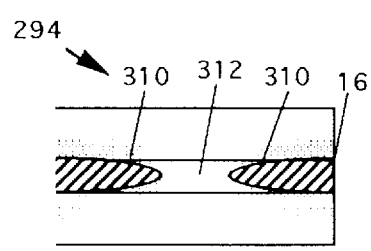

Turning now to FIG. 12a and 12b, there is shown lens 294 and another method for controlling the diameter of lens 294. The controlling method is similar to the method described above in connection with FIG. 11a and 11b. FIG. 12a illustrates a semiconductor layer structure comprising oxidizable layer 296 and non-oxidizable layer 298.

Also shown is an optional non-oxidizable layer 300. Mask 302, for example a photoresist, blocks bombardment of ions 304 except in preselected regions 306. The result is a distribution of implanted ions 308 which is least dense in the region below the center of mask 302 and more dense to either side. This embodiment functions similarly to that discussed with regard to FIG. 11, except that the ions increase the oxidation rate by a factor of 1.5 compared to the masked regions of oxidizable layer 296. When layer 296 is oxidized in regions 310, but not in regions 312, lens 294 is formed. Implanted ions 308 maybe dopant ions of either a p-type or n-type. Furthermore, when lens 294 is part of a device comprising a p-n junction, it may be preferable that the doping type match the side of the junction on which the lens 294 resides. For example, if lens 294 is on the p-side of the junction, it may be preferred that implanted ions 308 comprise a p-type dopant. In some cases, it may be preferable to perform an annealing step to enhance the effect of implanted ions 308. It is also possible that any of all of layers 296, 298 and 300 may be doped prior to implantation of ions 304. If implanted ions 308 are dopant ions of a given dopant type, it is possible for any or all of layers 296, 298 and 300 to be doped with a dopant of the same or opposite type. As illustrated in FIG. 12b, regions 310 may have a tapered profile which is at least partially due to the distribution of implanted ions 308 (shown in FIG. 12a).

In a preferred embodiment, oxidizable layer 296 may comprise a 700 Å thick layer of $Al_{0.98}Ga_{0.02}As$ n-doped with Si to a concentration of $1\times10^{18}cm^{-3}$, and layers 298 and 300 may be AlGAAs. The ions used in the implantation may comprise Be and the dosage my produce a volume density of about $5\times10^{18}cm^{-3}$. In the non-implanted region below the mask, only the Si ions are present which inhibit the oxidation process. In the implanted regions, the inhibiting action of the Si is canceled by the implanted Be ions. Thus, the oxidation rate proceeds faster outside of the masked region than inside.

It is important to note that it is not necessary for the implantation process to completely stop the oxidation process. A sufficient slowdown of the process allows reasonable tolerances in the timing of the oxidation so that a manufacturable process results.

It is to be appreciated and understood that any or all of the structures and methods described above may be used in combination. The means include: 1) variation in thickness of oxidizable layers as illustrated in FIGS. 1 and 2; 2) variation in thickness of non-oxidizable layers as illustrated in FIG. 8; 3) variation in Al concentration of oxidizable layers as illustrated in FIG. 4; 4) variation in Al concentration of non-oxidizable layers as illustrated in FIG. 8; 5) variation in doping concentration of oxidizable layers as illustrated in FIGS. 3 and 4; 6) use of interdiffusion between oxidizable and non-oxidizable layers as illustrated in FIG. 5; 7) local variation in ion implantation dose as illustrated in FIGS. 5, 6, 7, and 8; and 8) variation in mesa diameter as is taught by the prior art with regard to a single oxidizable layer.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed:

1. An aperture comprising:
   at least a first lens layer having a first thickness, said first lens layer comprising a first oxidized portion and a first non-oxidized portion, said first lens layer comprising a semiconductor material having a first aluminum content greater than 20%;
   at least a second layer having a second thickness and in communication with said first lens layer, said second layer comprising a non-oxidized semiconductor having a second aluminum content not equal to said first aluminum content; and
   at least a first interdiffused region partially disposed in said first non-oxidized portion comprising materials from both of said first and second layers, said first interdiffused region penetrating to a first thickness at a first point in said first non-oxidized portion and to a lesser thickness at a second point in said first oxidized portion.

2. The aperture recited in claim 1, wherein said interdiffused region has an aluminum content less than said first aluminum content.

3. The aperture recited in claim 1, wherein said first non-oxidized portion at said first point extends entirely through said first lens layer.

4. The aperture recited in claim 1, wherein said first interdiffused region extends only partially through said first lens layer.

5. The aperture recited in claim 1, further comprising:
   at least a third layer having a third thickness and in communication with said second layer, said third layer comprising a third oxidized portion and a third non-oxidized portion, said third non-oxidized portion comprising a semiconductor having a third aluminum content; and
   at least a second interdiffused region partially disposed in said third non-oxidized portion comprising materials from both of said second and third layers, said second interdiffused region penetrating to a third thickness at a third point in said third non-oxidized portion and to a lesser thickness at a fourth point in said third oxidized portion.

6. The aperture recited in claim 5, wherein said first non-oxidized portion penetrates entirely through said first lens layer over a first area, and said third non-oxidized portion penetrates entirely through said third layer over a third area, said third area being at least 4% larger than said first layer.

7. The aperture recited in claim 5 in which said third thickness differs from said first thickness by a value greater than 2.5 Å.

8. The aperture recited in claim 7, wherein said third thickness is less than said first thickness.

9. The aperture recited in claim 5, wherein said first non-oxidized portion penetrates entirely through said first lens layer over a first area, and said third non-oxidized portion penetrates entirely through said third layer over a third area, said third area being at least 4% larger than said first area.

10. The aperture recited in claim 5, wherein said third thickness differs from said first thickness by a value greater than 4% of said first thickness.

11. The aperture recited in claim 10, wherein said first non-oxidized portion penetrates entirely through said first lens layer over a first area, and said third non-oxidized portion penetrates entirely through said third layer over a third area, said third area being at least 4% larger than said first area.

12. The aperture recited in claim 5, wherein said third aluminum content differs from said first aluminum content by a value greater than 0.01% of said first aluminum content.

13. The aperture recited in claim 12, wherein said fist non-oxidized portion penetrates entirely through said first lens layer over a first area, and third non-oxidized portion penetrates entirely through said third layer over a third area, said third area being at least 4% larger than said first area.

14. The aperture recited in claim 5, further comprising:
   at least a fourth layer having a fourth thickness and in communication with said third layer, said fourth layer comprising a non-oxidized semiconductor having a fourth aluminum content; and
   at least a third interdiffused region partially disposed in said third non-oxidized portion comprising materials from both of said third and fourth layers, said third interdiffused region penetrating to a fifth thickness at a fifth point in said third non-oxidized portion and to a lesser thickness at a sixth point in said third oxidized portion.

15. The aperture recited in claim 14, wherein said fourth aluminum content differs from said second aluminum content by a value greater than 0.01% of said second aluminum content.

16. The aperture recited in claim 15, wherein said first non-oxidized portion extends entirely through said first lens layer over a first area, and said third non-oxidized portion extends entirely through said third lens layer over a third area, and in which said first area is at least 4% larger than said third area.

17. The aperture recited in claim 14, wherein said fourth thickness differs from said second thickness by a value greater than 5% of said second thickness.

18. The aperture recited in claim 17, wherein said first non-oxidized portion extends entirely through said first lens layer over a first area, and said third non-oxidized portion extends entirely through said third layer over a third area, and in which said first area is at least 4% larger than said third area.

19. The aperture recited in claim 5, wherein centers of said first and third layers are separated by less than 1000 Å.

20. The aperture recited in claim 1, further comprising:
   a first conductive layer having a first conductivity type;
   a light emitting material, said light emitting material disposed above said first conductive layer and in electrical communication therewith;
   a second conductive layer having a second conductivity type, said second conductive layer being disposed above said light emitting material and in electrical communication therewith;
   electrical communication means for providing electrical communication to said light emitting material; and
   wherein said first lens layer proximal to said light emitting material.

21. The light emitting device recited in claim 20, further comprising a first mirror disposed below said light emitting material and a second mirror disposed above said light emitting material.

22. An aperture comprising:

at least a first lens layer having a first thickness, said first lens layer comprising a first oxidized portion and a first non-oxidized portion, said first lens layer comprising a semiconductor material having a first aluminum content greater than 20%;

at least a second layer adjacent to said first lens layer, said second layer comprising a non-oxidized semiconductor having a second aluminum content not equal to said first aluminum content;

at least a first interdiffused region aligned with said first non-oxidized portion comprising materials from both of said first and second layers, said first interdiffused region penetrating to a first thickness at a first point in said first non-oxidized portion and to a lesser thickness at a second point in said first oxidized portion, a difference between said first thickness and said second thickness being sufficiently large to reduce an oxidation rate of said first lens layer in said interdiffused region to less than 50% of an oxidation rate of said first lens layer outside of said interdiffused region.

23. The aperture recited in claim 22, further comprising:

a first conductive layer having a first conductivity type;

a light emitting material, said light emitting material disposed above said first conductive layer and in electrical communication therewith;

a second conductive layer having a second conductivity type, said second conductive layer being disposed above said light emitting material and in electrical communication therewith;

electrical communication means for providing electrical communication to said light emitting material; and wherein said first lens layer proximal to said light emitting material.

24. The light emitting device recited in claim 23, further comprising a first mirror disposed below said light emitting material and a second mirror disposed above said light emitting material.

* * * * *